United States Patent [19]
Vai et al.

[11] Patent Number: 5,187,452
[45] Date of Patent: Feb. 16, 1993

[54] CONTROL CIRCUIT FOR AN OSCILLATOR

[75] Inventors: Gianfranco Vai, Pavia; Maurizio Zuffada, Milan; Fabrizio Sacchi, Pavia; David Moloney, Cornaredo; Giorgio Betti, Milan, all of Italy

[73] Assignee: SGS-Thomson Microelectronics S.r.l., Milan, Italy

[21] Appl. No.: 813,154

[22] Filed: Dec. 23, 1991

[30] Foreign Application Priority Data

Dec. 28, 1990 [IT] Italy .................. 22551 A/90

[51] Int. Cl.$^5$ ............................. H03B 5/24
[52] U.S. Cl. .................... 331/113 R; 331/144
[58] Field of Search .................. 331/113 R, 144; 307/265, 270; 332/109, 110

[56] References Cited
U.S. PATENT DOCUMENTS
4,292,605 9/1981 Rodgers, III ............ 331/113 R X OTHER PUBLICATIONS
"Analysis and Design of Analog Integrated Circuits", pp. 590-593, published by Wiley, 1977.

Primary Examiner—David Mis
Attorney, Agent, or Firm—Rosen, Dainow & Jacobs

[57] ABSTRACT

A control circuit for an oscillator comprising a multivibrator with transistors having their emitters connected in common and being supplied corresponding currents on respective legs, comprises a circuit structure adapted to produce on output terminals, on the one side, a current which is proportional to a reference current according to a predetermined parameter, and on the other side, a second current in turn correlated to the reference current as a function of said parameter, thereby to modify the oscillator duty cycle for a given operating frequency.

7 Claims, 2 Drawing Sheets

CONTROL CIRCUIT FOR AN OSCILLATOR

DESCRIPTION

This invention relates to a control circuit for an oscillator, comprising a multivibrator with common emitter-connected transistors which are supplied corresponding currents on respective legs.

BACKGROUND OF THE INVENTION

Voltage-controlled oscillators (VCO) are widely employed today in a multiplicity of electronic apparatus, particularly for modulating and de-modulating RF signals.

Such oscillators are mostly provided, in integrated circuit form, with RC multivibrators wherein the capacitor charge current is varied in response to a control pulse.

A typical example of a device of this kind is described, for example, in "Analysis and Design of Analog Integrated Circuits", pages 590–593, published by Wiley, 1977.

Devices of this kind require that the duty cycle of the synthesized waveform can be varied as desired without changing the oscillation frequency.

No suggestion from the prior art has been known which could meet said requirement.

SUMMARY OF THE INVENTION

The underlying technical problem of this invention is to provide a control circuit for an oscillator, which has such structural and functional features as to enable the oscillator duty cycle to be varied at will while keeping the oscillation frequency unaltered.

The solutive idea on which the invention stands is one of supplying the two opposed legs of the multivibrator with currents which differ from each other but are correlated by a parameter which can be changed to suit the user's demand.

This technical problem is solved by a circuit as indicated being characterized in that is comprises a circuit structure effective to produce on output terminals, on the one side a first current I1, which is proportional to a reference current I, according to a predetermined parameter 5, and on the other side, a second current I2 correlated to the reference current by the following relation I2=I/(2−1/§), thereby to modify the oscillator duty cycle for a given operating frequency.

SUMMARY OF DRAWINGS

The features and advantages of the inventive circuit will be apparent from the following detailed description of an embodiment thereof, given by way of example and not of limitation with reference to the accompanying drawings.

In the drawings.

DESCRIPTION OF THE PREFERRED EMBODIMENT(S)

Figure 1:
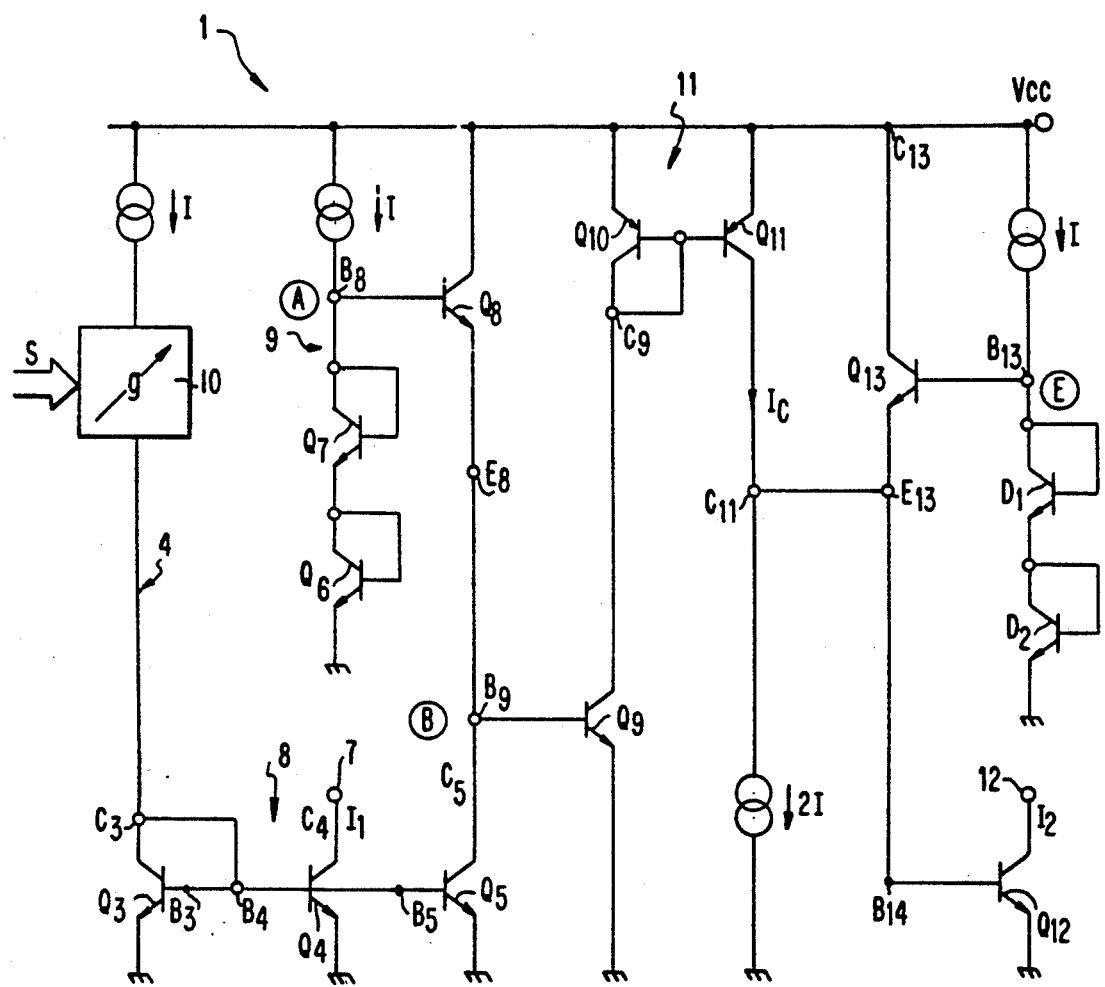
FIG. 1 is a diagrammatic representation of the circuit according to the invention.

With reference to the drawing figures, generally and schematically shown at 1 is a circuit embodying the invention, intended for controlling an oscillator 2.

Figure 2:
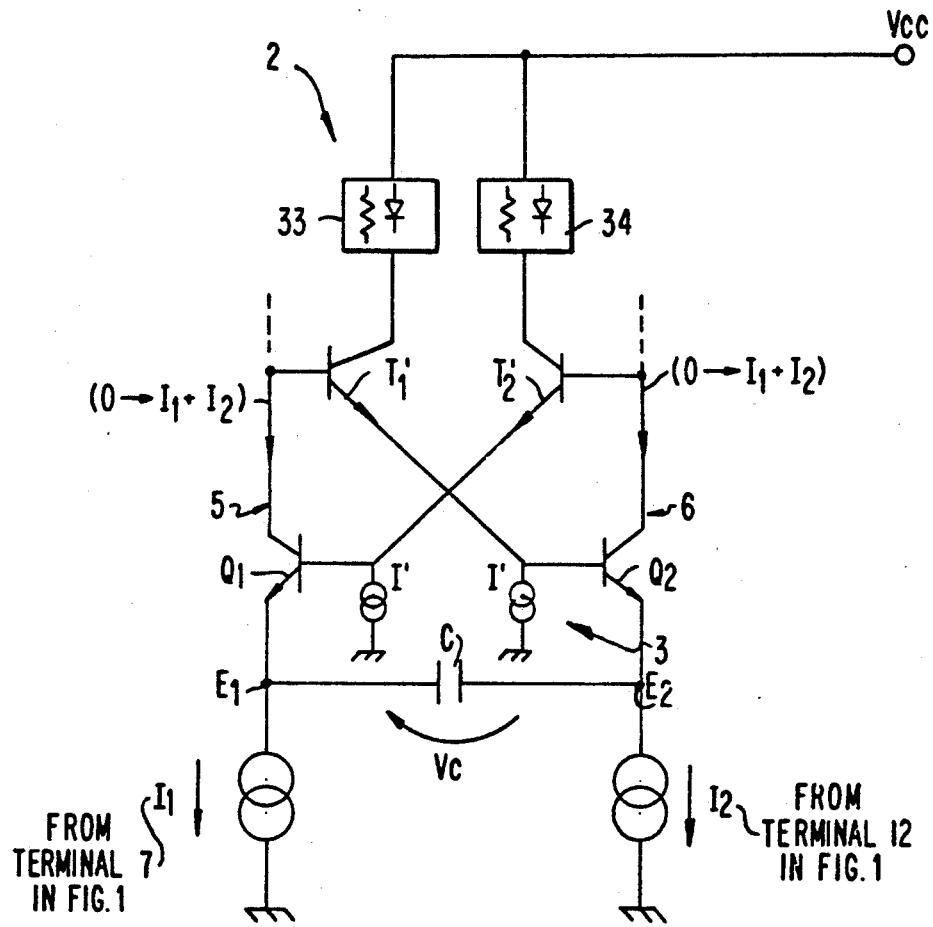
FIG. 2 is a diagramatic representation of an oscillator wherewith the circuit of FIG. 1 is associated.

The oscillator 2 is of the VCO (Voltage-Controlled Oscillator) type and conventional in structure. It comprises a so-called multivibrator 3 which includes a pair of transistors Q1, Q2 having their emitters E1, E2 coupled through a capacitor C. An example of such an oscillator 2 is described on page 591 of the text "Analysis and Design of Analog Integrated Circuits", published by Wiley, 1977. The blocks designated 33, 34 in FIG. 2 correspond to the resistors R and the diodes Q5, Q6 shown in the page 591 circuit.

The transistors Q1, Q2 of the oscillator are driven by corresponding legs 5 and 6 to which there are connected as emitter followers corresponding transistors T1', T2' between a positive supply pole Vcc and two current sources I' identical with each other.

The circuit 1 of this invention is associated with the oscillator 2 and comprises a first leg 4 having a reference current source I in series with a multiplier node 10. This node 10 multiplies the value of current I by a parameter § which varies according to a signal S received on another input.

Also provided is a current mirror 8 comprising a first transistor Q3 in a diode configuration and having its collector C3 connected to the node 10 output and its emitter to ground, and a second transistor Q4 having its base B4 connected to the base B3 of the first transistor and its collector C4 arranged to form an output terminal 7 whence a current I1 can be tapped.

A second leg 9 of the circuit 1 comprises a serial connection of two transistors Q6 and Q7 in a diode configuration which are connected between ground and a circuit node A to which a second current source I is also led. The node A is also connected to the base B8 of a transistor Q8 which has its emitter E8 connected to the collector C5 of a transistor Q5 to define a second circuit node B. This transistor Q5 has its base B5 connected in common with transistor Q4 in the mirror 8.

Also connected to the node B is the base B9 of a transistor Q9 which is energized, through its collector C9, from a current mirror 11 formed of a pair of transistors Q10 and Q11.

The collector C11 of transistor Q11 is connected to ground through a current source having a value of 2I. Led to said collector are, moreover, the base B14 of a transistor Q12 having the emitter grounded, and the emitter E13 of a transistor Q13 having its collector energized from the pole Vcc.

The base B13 of this transistor Q13 defines a node E and is energized through a current source I connected between the supply pole Vcc and ground by means of a series of two transistors D1 and D2 in a diode configuration.

The collector of transistor Q12 constitutes the output terminal 12 whence a current I2 is tapped. The current I2 in FIG. 1 corresponds to the current source designated I2 in FIG. 2. The current I1 at terminal 7 in FIG. 1 corresponds to the current source designated I1 in FIG. 2.

By supplying the legs 5 and 6 of the oscillator 2 with the sum of currents I1 and I2, actually, the current into the collectors of Q1 and Q2 vary between 0 and I1+I2 during operation of the oscillator, as Q1 and Q2 turn ON and OFF an oscillation period To is obtained which is given by the following formula:

$$To = 2 \cdot C \cdot \Delta V \cdot (1/I1 + 1/I2) = T1 + T2$$

where, $C \cdot \Delta V$ is the capacitor charge.

In the event of equivalence of currents I1 and I2, i.e. where I1=I2=I, the capacitor C would be charged and discharged at constant current I, and accordingly, an oscillation is obtained with a 50% duty cycle.

On the other hand, where current I1 is less than I2, the duty cycle is bound to exceed 50%.

However, it is apparent that in order to keep the oscillation frequency constant, the sum of the two time periods T1 and T2 due to different values of the currents I1 and I2 should be constant at all times. In other words, the sum of 1/I1 plus 1/I2 must be constant.

The inventive circuit is directed to synthesize the values of I1 and I2 from a reference current I and by means of parameter §, such that:

$$I1 = §I \text{ and } I2 = 1/(2/I - 1/§I).$$

It can be readily verified that, with the control circuit of this invention, the sum of 1/I1 plus 1/I2 is 2/I for any value of parameter §.

The value of the output current I1 from terminal 7 is §I, on account of the multiplier 10 and the current mirror 8 comprising the transistors Q3 and Q4.

Also the current on the collector C5 of transistor Q5 is §I.

Because of the diodes Q6 and Q7 conducting a current I, the voltage Va on the node A will be twice the base-emitter voltage drop Vbe of Q6 and Q7.

This voltage drop Vbe is tied to thermal drift by the known formula below:

$$Vbe = V_T * \ln I/I_S.$$

Since transistor Q8 is also conducting a current §I, as mirrored by transistor Q5, it follows that the voltage Vb appearing on the node B will be given by the difference between the base-emitter voltage drops of Q6, Q7 and Q8, namely:

$$Vb = 2Vbe - Vbe(Q8) = V_T * \ln I/§I_S.$$

It is thus evinced that the current flowing through transistor Q9 and appearing, by virtue of the mirror 11 comprised of transistors Q10 and Q11, on collector C11 will be, in turn, a function of parameter §, and be:

$$Ic = I/§.$$

Considering, now, that the voltage on the node E is the same as on node A, in accordance with the formula $Va = Ve = 2V_T * \ln I/I_S$, it follows that transistor Q13 will conduct a current resulting from the difference of 2I minus Ic, if the base current of Q14 is neglected.

Therefore, the base-emitter voltage drop of Q13 may be obtained from the following relation:

$$Vbe(Q13) = V_T * \ln[(2I - I/§)/I_S]$$

but, since Vbe(Q13) + Vbe(Q14) = Ve, it also follows that:

$$Vbe(Q14) = 2Vbe(I) - Vbe(2I - I/§)$$

$$Vbe(Q14) = V_T * \ln\{(I/I_S) * [I_S/(2I - I/§)]\}$$

$Vbe(Q14) = V_T * \ln[§I/(I_S(2§-1))]$, whence the value of current I2 can be obtained, as follows:

$$I2 = §I/(2§-1) = I/(2 - 1/§).$$

This current value enables the oscillation frequency of the oscillator 2 to be held constant while the duty cycle can be varied as desired by just changing the value of parameter §.

The circuit of this invention can be applied more generally to situations where the parallel of two quantities, such as resistances, conductances, voltages and/or currents, is to be held constant.

A value should be used, of course, for a parameter § which will suit a specific situation.

It may be further appreciated that the inventive circuit could be changed or modified within the invention scope. For example, the current mirrors 8 and 11 could be embodied differently from what has been indicated in the foregoing, by recovering base current from some transistors.

We claim:

1. A control circuit for an oscillator comprising a multivibrator which comprises first and second transistors each having an emitter and a collector and arranged in a common-emitter connection and connected to be supplied by said control circuit with currents to said emitters; said control circuit comprising first and second output terminals operatively connected to a respective one of said emitters for supplying same with first and second currents, respectively, and circuit means for supplying, respectively, to said first and second output terminals a first current I1 which is proportional to a reference current I according to a predetermined parameter §, and a second current I2 which is correlated to the reference current by the following relation $I2 = I/(2 - 1/§)$.

2. A circuit according to claim 1, wherein said control circuit comprises a first circuit leg having a reference current source supplying the reference current I in series with a multiplier node, said node being adapted to multiply the value of the reference current by said parameter which can be varied in response to a signal received on an input to said multiplier node.

3. A circuit according to claim 1, wherein said control circuit comprises current mirrors and transistors connected together and to said output terminals to produce said currents I1 and I2 from the reference current and according to said parameter.

4. A control circuit for maintaining constant the parallel of two electric quantities in an electronic device supplied with two currents; said control circuit comprising first and second output terminals operatively connected to said electronic device for supplying same with first and second currents, respectively, and circuit means for supplying, respectively, to said first and second output terminals a first current I1 which is proportional to a reference current I according to a predetermined parameter §, and a second current I2 which is correlated to the reference current by the following relation $I2 = I/(2 - 1/§)$.

5. In combination:
   (a) an oscillator comprising a multivibrator and oscillating at a given frequency,
      (i) said multivibrator comprising first and second transistors connected in a common emitter arrangement and having first and second emitters, respectively, and
   (b) a control circuit having an input and an output connected to said oscillator for varying its duty cycle in response to an input signal to the control circuit input but without varying the frequency of the oscillator.

6. The combination of claim 5, wherein the control circuit comprises:
  (i) means for generating a reference current I,
  (ii) means for modifying the reference current I in proportion to a predetermined parameter § whose value is dependent upon the input signal to the control circuit to produce a first current I1,
  (iii) means for modifying the reference current I to produce a second current I2 correlated to I by the following relation $I2=I/(2-1/\S)$,
  (iv) means for supplying the first current I1 to the first emitter of the oscillator and the second current I2 to the second emitter of the oscillator.

7. The combination of claim 5, wherein said control circuit comprises means for providing a first current I1 and a second current I2, means for supplying I1 to the first emitter and I2 to the second emitter, said control circuit being configured to maintain the sum of 1/I1 and 1/I2 constant despite changes in the input signal, and wherein said oscillator comprises capacitive means connected between the first and second emitters.

* * * * *